United States Patent
Ozawa et al.

(10) Patent No.: US 6,391,781 B1
(45) Date of Patent: *May 21, 2002

(54) METHOD OF MAKING A SEMICONDUCTOR DEVICE

(75) Inventors: Nobuo Ozawa; Hatsumi Ito, both of Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/478,524

(22) Filed: Jan. 6, 2000

(51) Int. Cl.[7] ............................................. H01L 21/302
(52) U.S. Cl. ...................... 438/692; 438/710; 438/723; 438/725
(58) Field of Search ......................... 438/221, 435–437, 438/424, 427, 626, 691, 692, 693, 723, 710, 725

(56) References Cited

U.S. PATENT DOCUMENTS

| 5,631,197 A | * | 5/1997 | Yu et al. | 438/699 |
| 5,693,566 A | * | 12/1997 | Cheung | 437/195 |
| 5,814,564 A | * | 9/1998 | Yao et al. | 438/723 |
| 5,837,612 A | * | 11/1998 | Ajuria et al. | 438/697 |
| 6,008,108 A | * | 12/1999 | Huang et al. | 438/436 |
| 6,114,220 A | * | 9/2000 | Tsai | 438/435 |
| 6,171,928 B1 | * | 1/2001 | Lou | 438/692 |

OTHER PUBLICATIONS

Wolf et al., Silicon Processing for the VLSI Era, 1986, vol. 1, p. 534 and 1990, vol. 2, pp. 229–230.*

* cited by examiner

*Primary Examiner*—Benjamin L. Utech
*Assistant Examiner*—Duy-Vu Deo
(74) *Attorney, Agent, or Firm*—Kanesaka & Takeuchi

(57) ABSTRACT

A method of manufacturing a semiconductor device using a shallow trench isolation (STI) process comprises the steps of depositing a Si3N4 film (3) by a chemical vapor deposition (CVD) process, polishing a CVD oxide film (6) by a chemical mechanical polishing (CMP). The method further comprises the steps of planarizing with an organic spin-on-glass (SOG) film (7) a rough surface of the silicon substrate resulting from a pattern dependency of polished amounts in the CMP process and etching back evenly the organic SOG film (7) and the CVD oxide film (6) buried in the trench at an etching selectivity ratio of 1.

20 Claims, 8 Drawing Sheets

METHOD OF MAKING A SEMICONDUCTOR DEVICE

BACKGROUND OF THE INVENTION

1. Field of the Invention

The present invention relates to a method of making a semiconductor device using a circuit-component isolation process.

2. Description of the Related Art

With the advent of a sub-micron technology, the circuit-component isolation method is changing from the local oxidation of silicon (LOCOS) to the shallow trench isolation (STI) method. The STI method is a technique comprising the steps of forming a trench in a substrate and burying an insulation film in the trench to form a circuit-component isolation region.

FIGS. 7(a)–(d) show an example of the STI process.

First of all, an oxide film 2 is formed on a surface of silicon substrate 1 by a thermal oxidation process to a thickness of 150 Angstroms, and a $Si_3N_4$ film 3 is deposited by a chemical vapor deposition (CVD) process to a thickness of 2000 Angstroms. Then, patterning is made by the conventional photolithography and dry-etching so as to keep the $Si_3N_4$ layer 3 and the pad oxide film 2 only in predetermined active regions. Then, the silicon substrate 1 is etched about 4000 Angstroms with a mask of the remaining photoresist pattern to form trenches 4. Then, the photoresist and etching reaction products are stripped by oxygen ashing and a treatment with persulfuric acid and a dilute fluoric acid aqueous solution to form a structure as shown in FIG. 7(a).

Then, thermal oxide films 5 are formed on the trench surfaces to a thickness of about 300 Angstroms, and then a CVD oxide film 6 is buried by a biased high density plasma (HDP) CVD process to form a structure as shown in FIG. 7(b).

Then, the CVD oxide film 6 is polished by a chemical mechanical polished (CMP) process to form a structure as shown in FIG. 7(c).

Then, the Si3N4 film patterns 3-1 and 3-2 are stripped by a thermal phosphoric acid process to provide a shallow trench isolation (STI) structure as shown in FIG. 7(d).

In the above CMP process, the Si3N4 film 3 is used as a polish stopper film. The polished amounts are different between the dense pattern 3-1 and coarse pattern 3-2 of the Si3N4 stopper film as shown in FIG. 7(c). The device characteristics (transistor hump characteristics) make it necessary that the height of the isolation oxide film 6-2 from the silicon surface be no less than 0 Angstrom even in the coarse pattern region where the CMP amount is large. Consequently, the height of the isolation oxide film 6-1 from the silicon surface in the dense pattern area becomes no less than about 1000 Angstroms. Where there is such a stepwise difference in polished amount between the isolation areas, it is necessary to strip by over-etching the stringer of a gate conductive pattern which crosses these isolation areas, thus presenting a problem that the margin of a remaining gate oxide film becomes too small.

SUMMARY OF THE INVENTION

Accordingly, it is an object of the invention to provide a method of making a semiconductor device using an STI process, wherein there are few variations in height of the isolation oxide film from the silicon surface.

It is another object of the invention to provide a method of making a semiconductor device, wherein the pad oxide film can be removed simultaneously.

It is still another object of the invention to provide a method of making a semiconductor device, which has an improved spin-on-glass (SOG) removal margin.

It is yet another object of the invention to provide a method of making a semiconductor device, which has a reduced manufacturing cost.

It is another object of the invention to provide a method of making a semiconductor device, wherein the thermal phosphoric acid process can be removed.

It is still another object of the invention to provide a method of making a semiconductor device, wherein detecting a finishing point of etching is made easy.

According to an aspect of the invention, there is provided a method of making a semiconductor device which comprises the steps of depositing a Si3N4 film by a chemical vapor deposition (CVD) process, polishing a CVD oxide film by a chemical mechanical polishing (CMP), planarizing with a coat of organic spin-on-glass (SOG) a rough surface of the silicon substrate resulting from a pattern dependency of polished amounts in the CMP process and etching back evenly the organic SOG and the CVD oxide film buried in the trench at an etching selectivity ratio of 1.

According to an another aspect of the invention, there is provided a method of making a semiconductor device which comprises the steps of depositing a Si3N4 film by CVD process, polishing a CVD oxide film by CMP, planarizing with a coat of organic SOG a rough surface of the silicon substrate resulting from a pattern dependency of polished amounts in the CMP process and etching back evenly the organic SOG and the CVD oxide film buried in the trench at an etching selectivity ratio less than 1.

According to still another aspect of the invention, there is provided a method of making a semiconductor device which comprises the steps of depositing a Si3N4 film by CVD comprises, polishing a CVD oxide film by CMP, planarizing with a coat of organic SOG a rough surface of said silicon substrate resulting from a pattern dependency of polished amounts in the CMP process and etching back evenly the organic SOG and the CVD oxide film buried in the trench by a two-step etching under two conditions that selectivity ratios are 1 and less than 1, respectively.

According to yet another aspect of the invention, there is provided a method of making a semiconductor device which comprises the steps of depositing a Si3N4 film by CVD process, planarizing with a coat of organic SOG a rough surface of the silicon substrate, and etching back evenly the organic SOG and the CVD oxide film buried in the trench at an etching selectivity ratio of 1, wherein no CMP is included in steps of the aspect.

According to another aspect of the invention, there is provided a method of making a semiconductor device which comprises the steps of depositing a poly-silicon film by CVD process, planarizing with a coat of organic SOG a rough surface of the silicon substrate, and etching back evenly the organic SOG and the CVD oxide film buried in the trench at an etching selectivity ratio of 1 and etching the CVD oxide film with a fluoric acid aqueous solution, wherein no CMP is used.

According to still another aspect of the invention, there is provided a method of making a semiconductor device which comprises the steps of depositing a O3-TEOS-NGS film by CVD process, planarizing with a coat of organic SOG a rough surface of the silicon substrate, etching back evenly the organic SOG and the CVD oxide film buried in the trench at an etching selectivity ratio of 1 and etching the CVD oxide film and the O3-TEOS-NGS film with a fluoric acid aqueous solution, wherein no CMP is used.

DESCRIPTION OF THE PREFERRED EMBODIMENTS

The first embodiment of the invention will be described with reference to FIGS. 1(a)–(e).

Figure 1A:
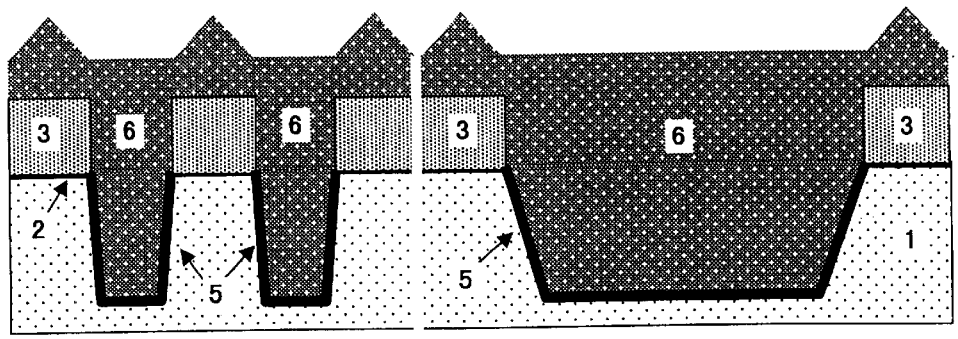
FIGS. 1(a)–(e) are sectional views of a semiconductor device according to a first embodiment of the invention.

In FIG. 1(a), an oxide film 2 is formed on the surface of a silicon substrate 1 by a thermal oxidation process to a thickness of 150 Angstroms, and a Si3N4 film 3 is deposited by the CVD process to a thickens of 2000 Angstroms. Then, patterning is made by the conventional photolithography and dry-etching so as to keep the Si3N4 film 3 and the oxide film 2 only in predetermined active regions. Then, the silicon substrate 1 is etched by about 4000 Angstroms with a mask of the remaining photoresist pattern to form trenches. Then, the photoresist and etching reaction products are stripped by oxygen ashing and the treatment with persulfuric acid and a dilute fluoric acid aqueous solution. As shown in FIG. 1(a), thermal oxide films 5 are formed on the trench surfaces to a thickness of about 300 Angstroms, and a CVD oxide film 6 is buried by the biased HDP CVD process.

Figure 1B:
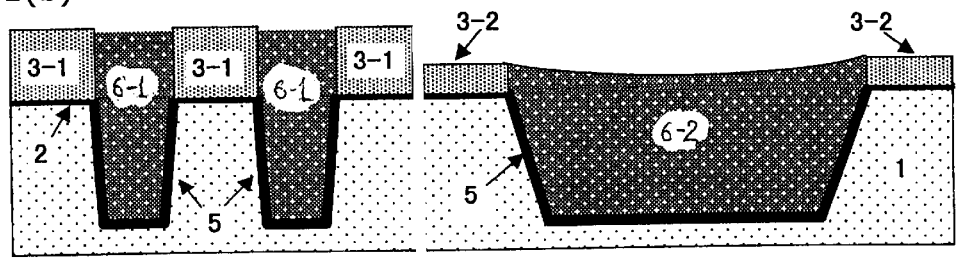

In FIG. 1(b), the CVD oxide film 6 is polished by the CMP process, in which the polished amounts are different between the dense pattern area 6-1 and the coarse pattern area 6-2 of the CVD oxide film 6.

In the CMP equipment used in the CMP process, the silicon substrate 1 is fixed to the mount plate such that the polished surface of the silicon substrate 1 faces downwardly. The polished surface is pressed to the turn table, with a polishing cloth attached thereto during polishing. The mount plate also rotates at a predetermined revolution speed. A constant amount of slurry or solution containing polishing particles is poured onto the rotating turn table. The silicon substrate 1 is fixed by a top ring of the mount plate and pressed uniformly by a polish force from back. In addition, the mount plate is provided with a back pressure mechanism to apply more uniform pressure by air to the substrate 1 from back. The CMP conditions are as follows.

Number of revolutions: turn table (TT)/top ring (TR)= 100/10 (rpm)

Pressure on the substrate: polish force (PF)/back pressure (BP)=500/400 (g/cm$^2$)

Supply of slurry: 200 (ml/min) In this embodiment, the slurry contains ceria.

Figure 1C:
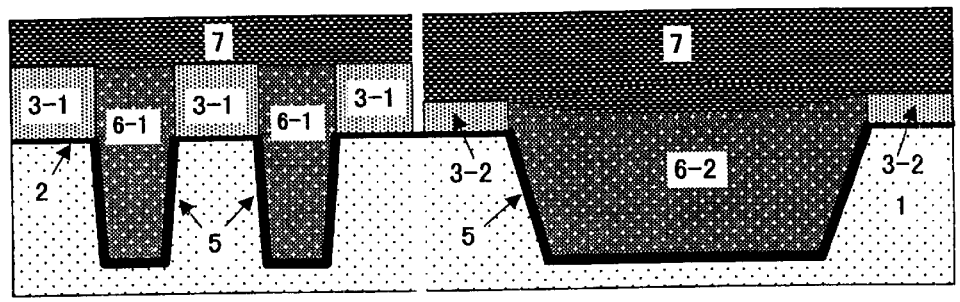

In FIG. 1(c), the rough surface made by the CMP process is planarized by a coat of organic spin-on-glass (SOG) 7.

Figure 1D:
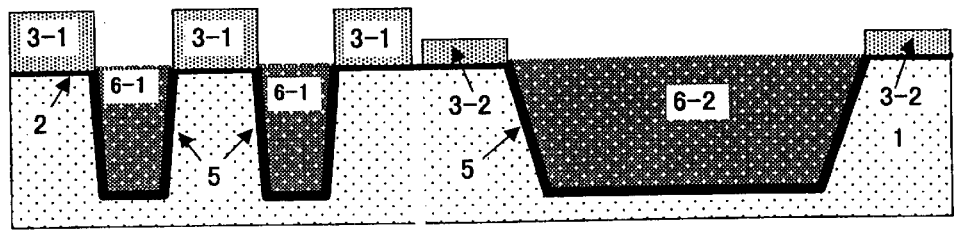

In FIG. 1(d), the organic SOG 7 and the CVD oxide film 6 are etched back evenly by the fluorocarbon plasma. The etch-back time is set such that the height (protruded height) of the CVD oxide film from the silicon surface becomes about 150 Angstroms. That is, the height of the protruded CVD oxide film is set such that (1) it is no less than 0 Angstrom after removal of the oxide film and cleaning treatment with the fluoric acid aqueous solution and (2) it is the smallest at a time of formation of gate conductive pattern. The etch-back conditions are such that the etching selectivity ratio of the CVD oxide film 6 to the organic SOG 7 is 1. For example, in a parallel flat plate type plasma etcher, the gas pressure is 0.5 Torr, the gas flow ratio between CF4/CHF3/Ar is 5/1/40, and the RF power is 800 W. The etch-back is followed by the oxygen ashing process to strip the fluorocarbon film which adheres to the wafer surface.

Figure 1E:
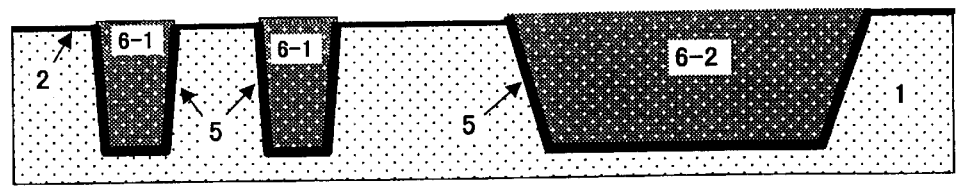

In FIG. 1(e), the Si3N4 film patterns 3-1 and 3-2 are stripped by a thermal phosphoric acid treatment to provide an STI structure as shown.

The use of the SOG coating and etch-back according to the first embodiment remarkably reduces variations in the height of the isolation CVD oxide film from the silicon surface which results from the pattern dependency of CMP amounts.

The second embodiment of the invention will now be described with reference to FIGS. 2(a)–(d).

Figure 2A:
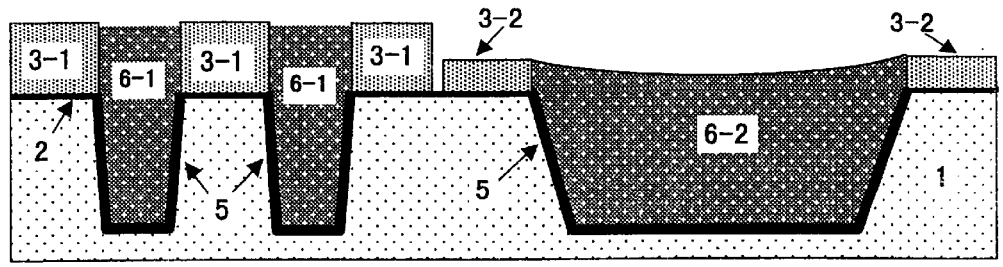
FIGS. 2(a)–(d) are sectional views of a semiconductor device according to a second embodiment of the invention.

The fabrication process up to FIG. 2(a) is the same as the fabrication process up to FIG. 1(b).

Figure 2B:
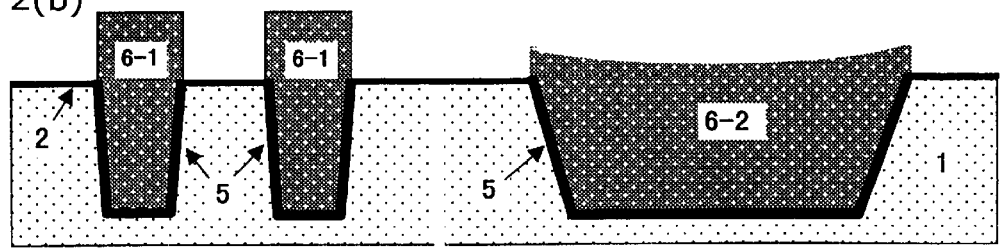

In FIG. 2(b), the Si3N4 film patterns 3-1 and 3-2 are then stripped by the thermal phosphoric acid treatment.

Figure 2C:
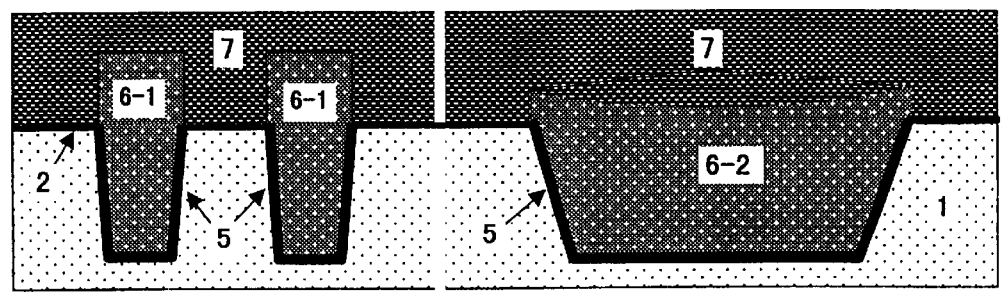

In FIG. 2(c), the rough surface of the wafer is then planarized by a coat of organic SOG 7.

Then, the organic SOG 7 and the CVD oxide films 6-1 and 6-2 are etched back evenly with the fluorocarbon plasma. The etching selectivity ratio of the CVD oxide film to the organic SOG under the etch-back condition is determined such that (1) the difference between H1 and H2 by the following equations is minimized and (2) H2 is no less than 0 Angstrom even after the oxide film removal and the cleaning treatment with fluoric acid aqueous solution.

$$H1=h1-(h1+X)*S$$

$$H2=h2-(h2+X)*S$$

wherein

H1: the height of CVD oxide film 6-1 in dense pattern area after the etch-back;

H2: the height of CVD oxide film 6-2 in coarse pattern area after the etch-back;

h1: the height of CVD oxide film 6-1 in dense pattern area prior to the etch-back;

h2: the height of CVD oxide film 6-2 in coarse pattern area prior to the etch-back;

X: the SOG overreaching amounts; and

S: the etching selectivity ratio of CVD oxide film to SOG. For example, if h1=2000 Angstroms, h2=800 Angstroms, X=150 Angstroms, and S=0.7, then H1=495 Angstroms and H2=135 Angstroms. Thus, the difference in the height of CVD oxide film between the dense and coarse areas caused by the CMP process is reduced from 1200 Angstroms to 360 Angstroms by the SOG etch-back. The etch-back conditions at a selectivity ratio of 0.7 are, for example, as follow: the gas pressure is 0.5 Torr, the gas flow ratio between CF4/CHF3/02/Ar is 10/2/1/80, and the RF power is 800 W for a parallel flat plate type plasma etcher.

Figure 2D:
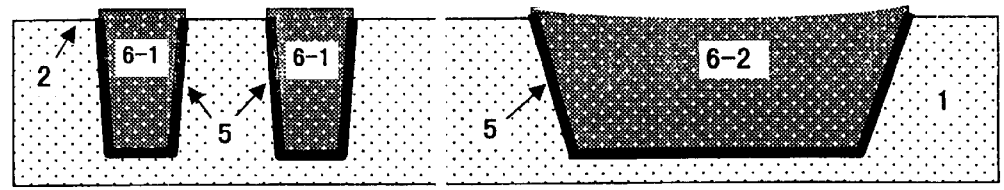

The etch-back is followed by the oxygen ashing to strip the fluorocarbon film adhered to the wafer surface, thereby providing an STI structure as shown in FIG. 2(d).

Another experiment was made under the following etch-back conditions. The etch-back process was made using a parallel flat plate type plasma etcher under such conditions as an RF power of 800 W and a gas pressure of 0.3–0.7 Torr. Three etching selectivity ratios of the CVD oxide film 6 to the organic SOG film 7 (hereinafter "selectivity ratio") were used; i.e., at a selectivity ratio of 0.4, a gas flow ratio between CF4/O2/Ar of 10/1/80 was employed;

at a selectivity ratio of 0.7, a gas flow ratio between CF4/Ar of 1/8 was employed; and at a selectivity ratio of 1.0, a gas flow ratio between CF4/CHF3/Ar of 5/1/40 was employed.

In each of the above etching processes, the over-etching time was set so that no organic SOG film remained.

A pattern was formed to measure a step difference between the component isolation oxide film 6-1 and the silicon substrate 1 (hereinafter "first step difference") and a step difference between the component isolation oxide film 6-2 and the silicon substrate 1 (hereinafter "second step difference"). In this pattern, a DRAM cell area (300 μm×300 μm or more) was formed for providing a step difference in the dense area. The step difference between this area and the silicon substrate 1 is taken as the first step difference. Similarly, another component isolation area (300 μm×300 μm or more) was formed for providing a step difference in the coarse area. The step difference between this area and the silicon substrate 1 was taken as the second step difference. 30 or more shots of chips having these patterns were formed in a silicon wafer as the silicon substrate 1. A measuring equipment for scanning with a needle was used for measurement of the first and second step differences. Measurements were taken at two points; the center and the periphery of the silicon wafer.

Among the above etching conditions, the processes at the selectivity ratios of 0.4, 0.7, and 1.0 are called Conditions 1, 2, and 3, respectively.

Figures 1, 2:
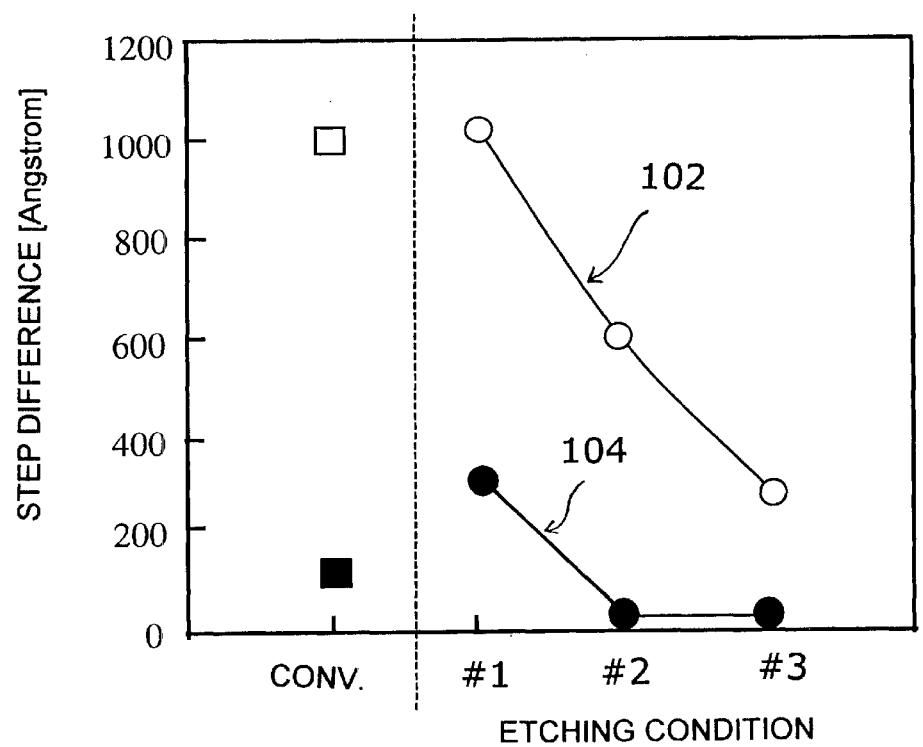
FIGS. 2-1 and 2-2 are graphs showing the dependency of step differences on the etching conditions.
Figure 2:
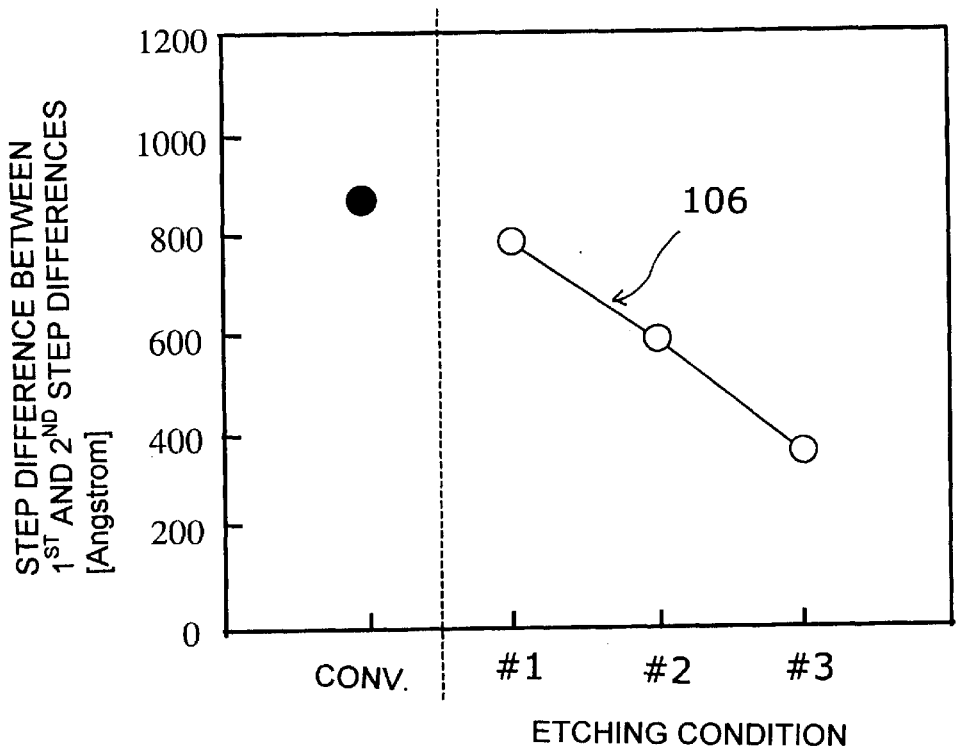

The results of the experiment are shown in FIGS. 2-1 and 2-2, wherein the above Conditions 1, 2, and 3 are shown on the horizontal axis and the step difference is on the vertical axis. The prior art is shown as Conv. for reference.

In FIG. 2-1, the first and second step differences (102, 104) measured at the center of the wafer are plotted. It shows the dependency of the first or second step difference on the etching conditions. That is, under the etching Condition 3, the first and second step differences are 300 and no more than 50 Angstroms, respectively, and better than the conventional process. Although they are not shown in the graph, the measurements at the periphery of the wafer produced substantially the same results.

In FIG. 2-2, the differences between the first and second step differences are plotted at 106. It shows the dependency of the difference between the first and second step differences on the etching conditions. This difference is produced by the influence of the pattern density so that the smaller the better. Under the etching Condition 3, the influence of the pattern density is reduced and better than the conventional process.

According to the second embodiment, the use of the SOG coating and the etch-back remarkably reduces variations in the height of isolation oxide film above the silicon surface which are caused by the pattern dependency of CMP amounts.

In addition, by adjusting the over-etch amount in the etch-back process it is possible to strip the oxide film at the same time.

The third embodiment of the invention will now be described with reference to FIGS. 3(a)–(c).

Figure 3A:
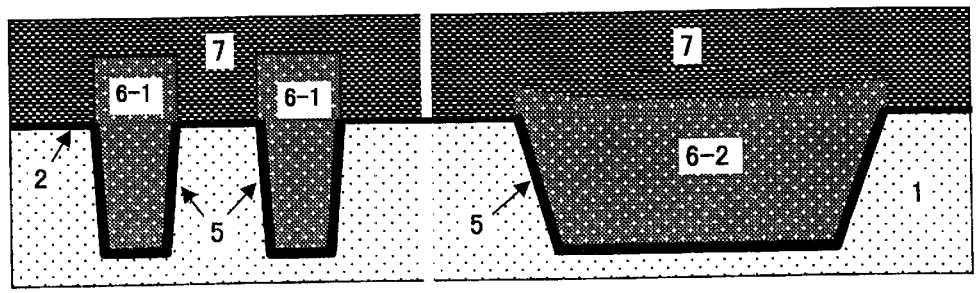
FIGS. 3(a)–(c) are sectional views of a semiconductor device according to a third embodiment of the invention.

The fabrication process up to FIG. 3(a) is the same as the fabrication process up to FIG. 2(c).

Then, both the organic SOG 7 and the CVD oxide films 6-1 and 6-2 are etched back evenly using two conditions of fluorocarbon plasma having different etching selectivity ratio of the CVD oxide film to the organic SOG.

Figure 3B:
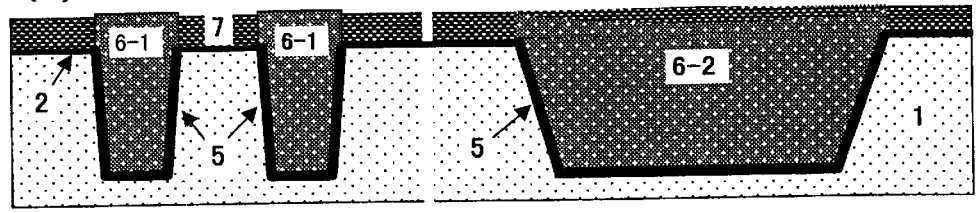

In FIG. 3(b), the first condition that the etching selectivity ratio of the CVD oxide film to the organic SOG is 1 is used for the first step etch-back. For example, the gas pressure is 0.5 Torr, the gas flow ratio between CF4/CHF3/Ar is 5/1/40, and the RF power is 800 W for a parallel flat plate type plasma etcher. The etch-back time is set such that the projection height of the CVD oxide film 6-1 is approximately 500 Angstroms.

In the second step, etch-back is made evenly by using such a fluorocarbon plasma that the selectivity rate of the CVD oxide film to the organic SOG is 0.5. For example, the gas pressure is 0.5 Torr, the gas flow ratio between CF4/O2/Ar is 25/2/200, and the RF power is 800 W in a parallel flat plate etcher. This etch-back completely removes the SOG.

Figure 3C:
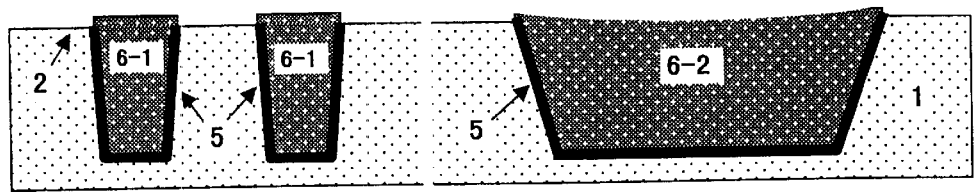

As shown in FIG. 3(c), the above two-step etch-back process provides an STI structure wherein the projection height of the CVD oxide film is approximately 250 Angstroms.

According to the third embodiment, the use of the organic SOG coating and etch-back remarkably reduces variations in the projection height of isolation oxide film.

Since the etch-back is divided into two steps; the first step that the etching selectivity ratio of the CVD oxide film to the SOG is 1 and the second step that the etching selectivity ratio of the CVD oxide film to the SOG is 0.5, by adjusting the etching time in the first and second steps, it is possible to provide a better SOG removal margin than that of the second embodiment.

The fourth embodiment of the invention will now be described with reference to FIGS. 4(a)–(e).

Figure 4A:
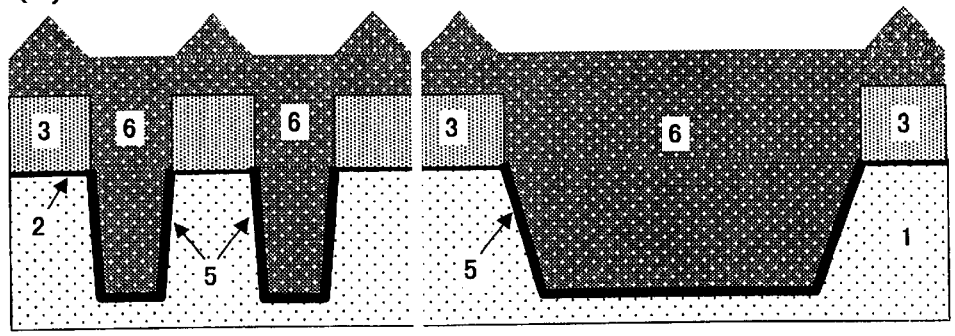
FIGS. 4(a)–(e) are sectional views of a semiconductor device according to a fourth embodiment of the invention.

The fabrication process up to FIG. 4(a) is the same as that of FIG. 1(a).

Figure 4B:
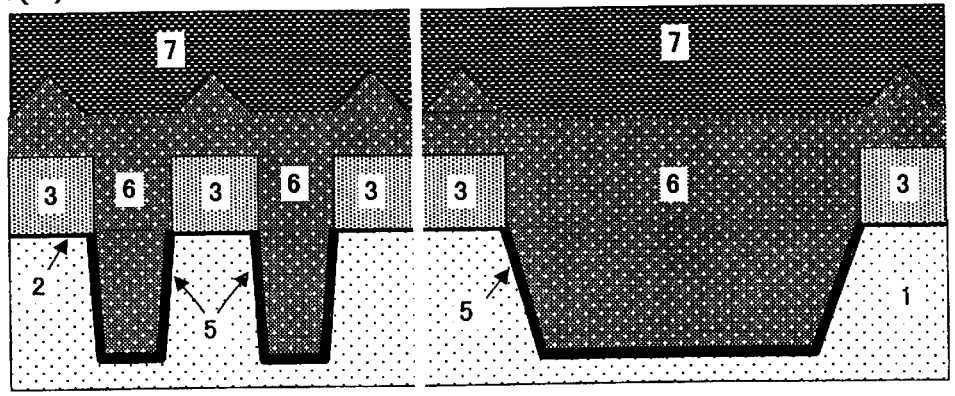

In FIG. 4(b), unlike the CMP of FIG. 1(b), the rough surface of the CVD oxide film 6 is planarized by coating the organic SOG 7.

Figure 4C:
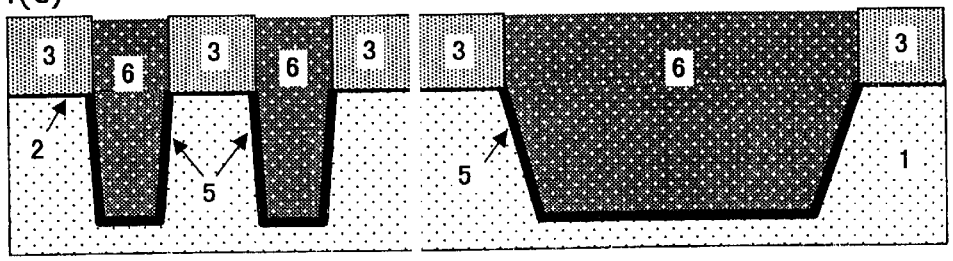

In FIG. 4(c), the organic SOG 7 and the CVD oxide film 6 are etched back evenly up to the top surface of Si3N4 film 3 by using a fluorocarbon plasma. The etch-back is made under the condition that the etching selectivity ratio of the CVD oxide film 6 to the SOG 7 is 1. For example, the gas pressure is 0.5 Torr, the gas flow ratio between CF/CHF/Ar is 5/1/40, and the RF power is 800 W for a parallel flat plate type etcher. The etch-back is followed by the oxygen ashing to strip the fluorocarbon film from the SOG surface.

Figure 4D:
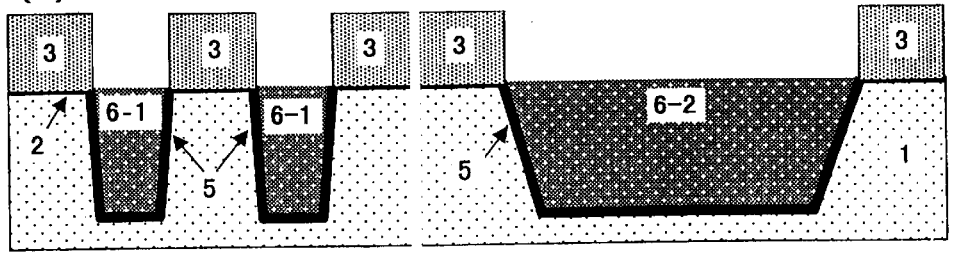

In FIG. 4(d), the CVD oxide film 6 is then etched with a fluoric acid aqueous solution to adjust the height of the CVD oxide film from the silicon substrate to approximately 150 Angstroms.

Figure 4E:
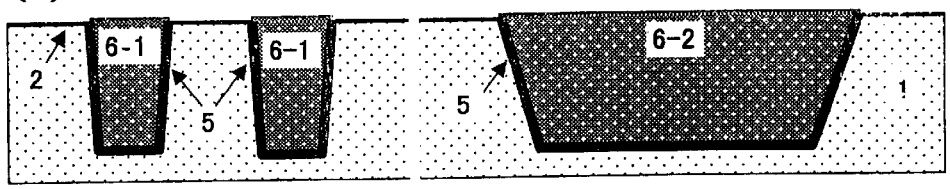

In FIG. 4(e), the Si3N4 film 3 is then stripped by the thermal phosphoric acid treatment to provide an STI structure as shown.

According to the fourth embodiment, CMP is not used so that it is possible to remarkably reduce variations in the height of the isolation oxide film which result from the pattern dependency of the CMP amounts. In addition, elimination of the CMP step reduces the manufacturing cost to a large extent.

The fifth embodiment of the invention will now be described with reference to FIGS. 5(a)–(e).

Figure 5A:
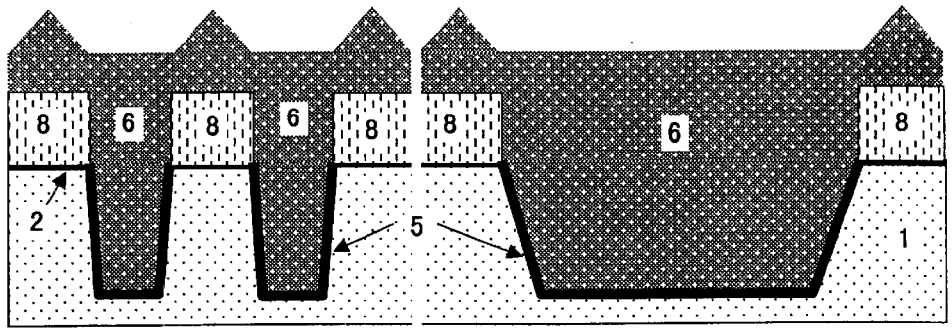
FIGS. 5(a)–(e) are sectional views of a semiconductor device according to a fifth embodiment of the invention.
Figure 5B:
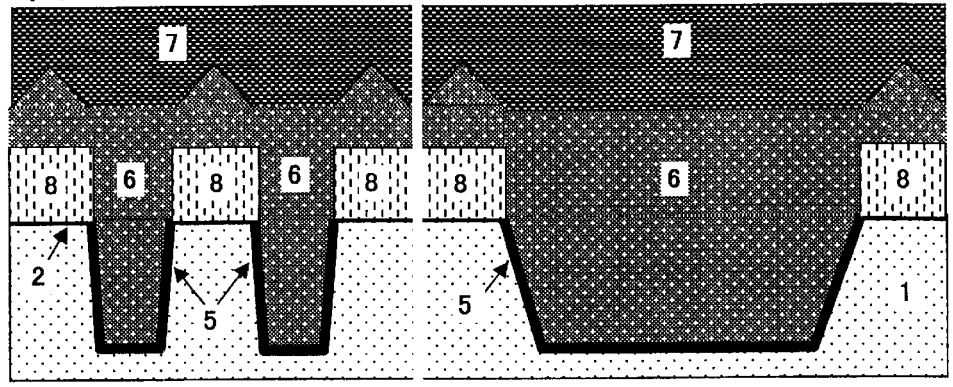
Figure 5C:
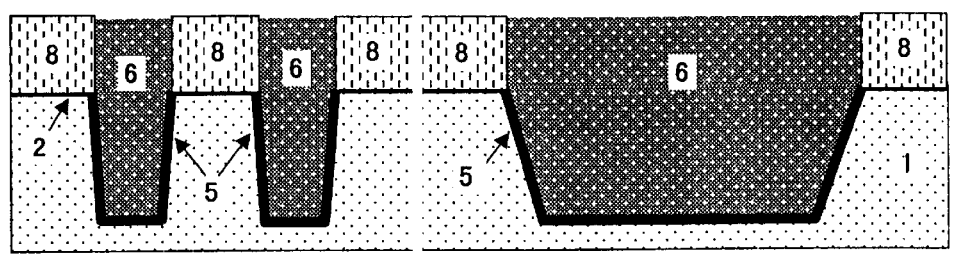

The fabrication process up to FIG. 5(b) is substantially the same as the fabrication process up to FIG. 4(b) except that the Si3N4 film 3 is replaced by a poly-silicon film 8. In FIG. 5(c), the organic SOG 7 and the CVD oxide film 6 are etched back evenly up to the top surface of the polysilicon pattern 8 with a fluorocarbon plasma. The etch-back condition is such that the etching selectivity ratio between the CVD oxide film 6 and the organic SOG 7 is 1. For example, the gas pressure is 0.5 Torr, the gas flow ratio between CF4/CHF3/Ar is 5/1/40, and the RF power is 800 W for a parallel flat plate type plasma etcher. The etch-back is followed by the oxygen ashing to strip the fluorocarbon film from the SOG surface.

Figure 5D:
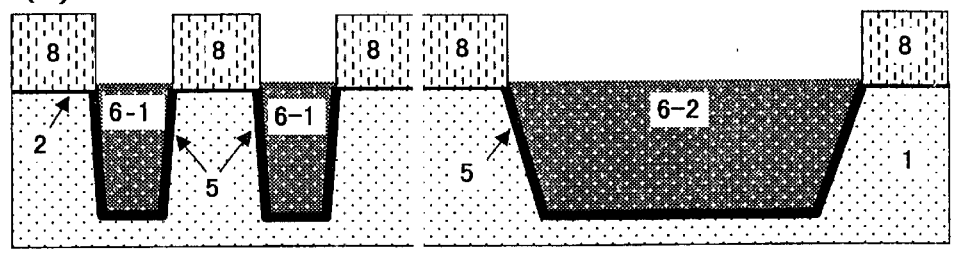

In FIG. 5(d), the CVD oxide film 6 is then etched with a fluoric acid aqueous solution to adjust the protruded height of the CVD oxide film 6 to approximately 150 Angstroms.

Figure 5E:
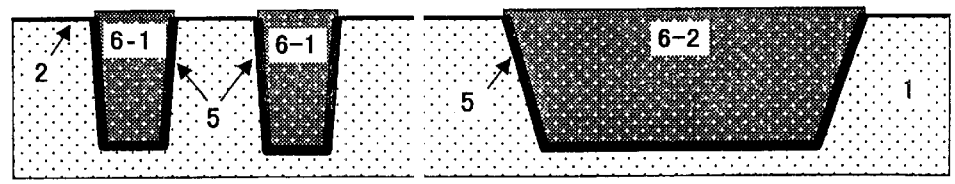

In FIG. 5(e), the poly-silicon pattern 8 is then stripped away using such a dry-etching condition that the selectivity ratio of the poly-silicon pattern 8 to the oxide film 2 is sufficiently high to provide an STI structure as shown.

Since the Si3N4 film in the fourth embodiment is replaced by the poly-silicon film, it is possible to strip the poly-silicon by dry-etching with a high selectivity ratio, thus eliminating the thermal phosphoric acid treatment which requires troublesome solution management. In addition, the fluorocarbon plasma has a high etching selectivity ratio with respect to the poly-silicon film to the CVD oxide film or organic SOG. Consequently, changes of the plasma intensity are so larger than those of the Si3N4 film in FIG. 4 at a time when the poly-silicon top surface is exposed by the etching back that it is easy to detect the finishing point of etching.

The sixth embodiment of the invention will now be described with reference to FIGS. 6(a)-(d).

Figure 6A:
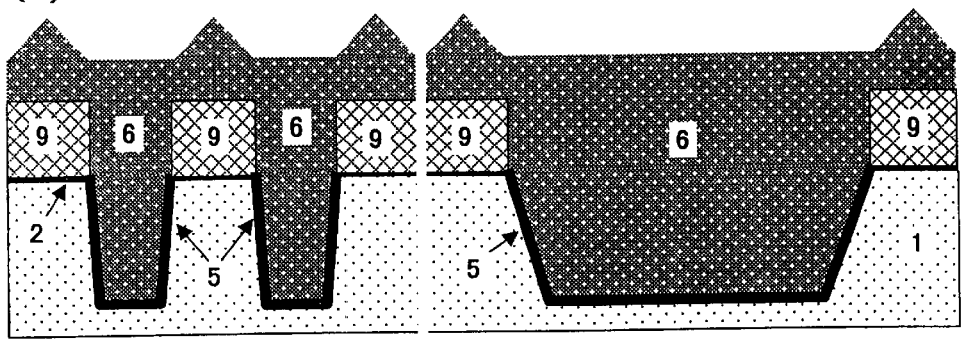
FIGS. 6(a)–(d) are sectional views of a semiconductor device according to a sixth embodiment of the invention.
Figure 6B:
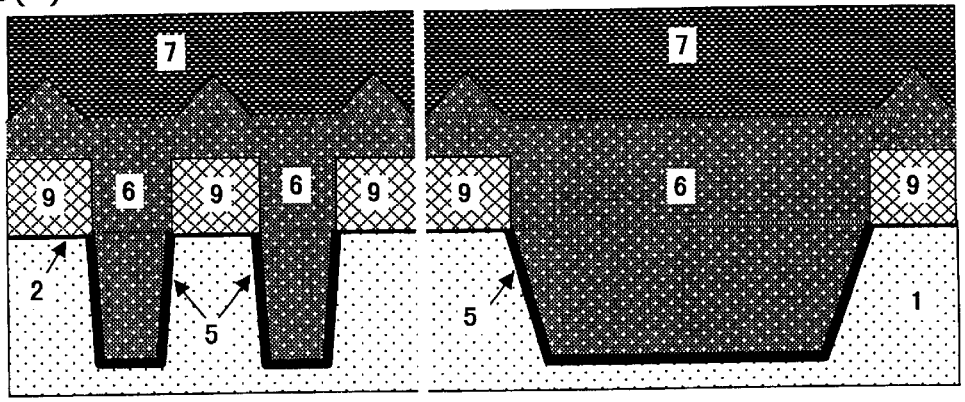

The fabrication process up to FIG. 6(b) is substantially the same as the fabrication process up to FIG. 4(b) except for replacement of the Si3N4 film with a CVD oxide film 9. The CVD oxide film is an O3-TEOS-NSG film.

Figure 6C:
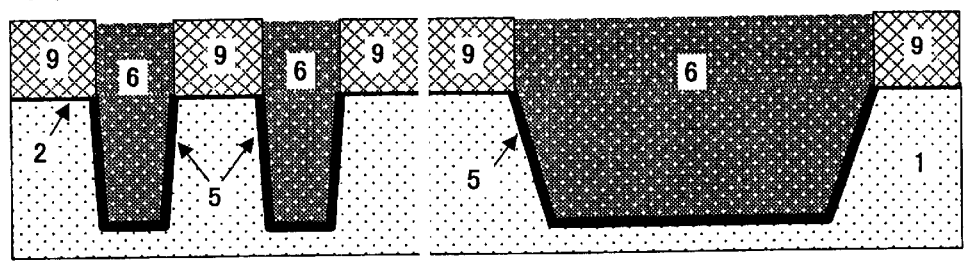

In FIG. 6(c), the organic SOG 7 and the CVD oxide film 6 are then etched back evenly by a fluorocarbon plasma until there is no organic SOG. The etch-back condition that the etching selectivity ratio of the O3-TEOS-NSG film and buried CVD oxide film to the organic SOG is 1 is used. For example, the gas pressure is 0.5 Torr, the gas flow ratio between CF4/CHF3/Ar is 5/1/40, and the RF power is 800 W for a parallel flat plate plasma etcher. The etch-back is followed by the oxygen ashing to strip the fluorocarbon film from the CVD oxide film.

Figure 6D:
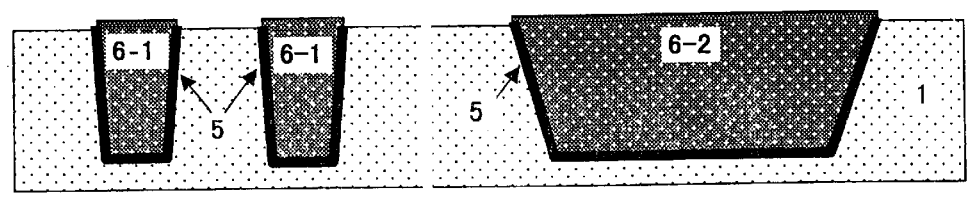
Figure 7A:
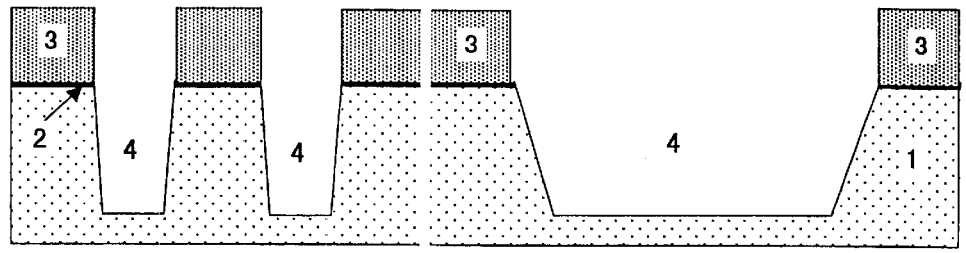
FIGS. 7(a)–(d) are sectional views of a semiconductor device according to a conventional method.
Figure 7B:
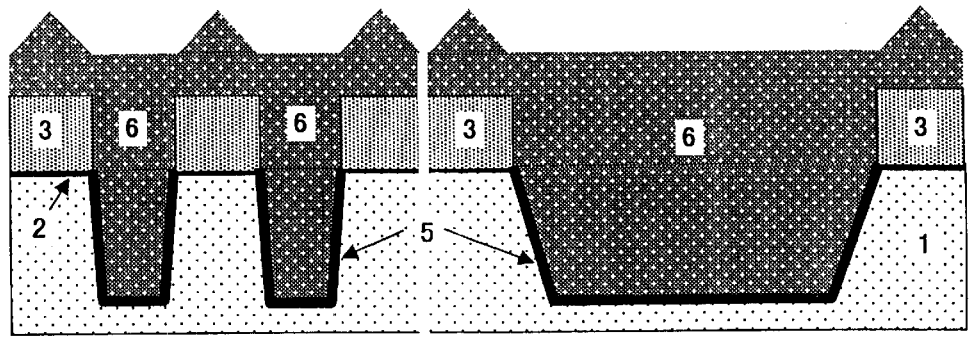
Figure 7C:
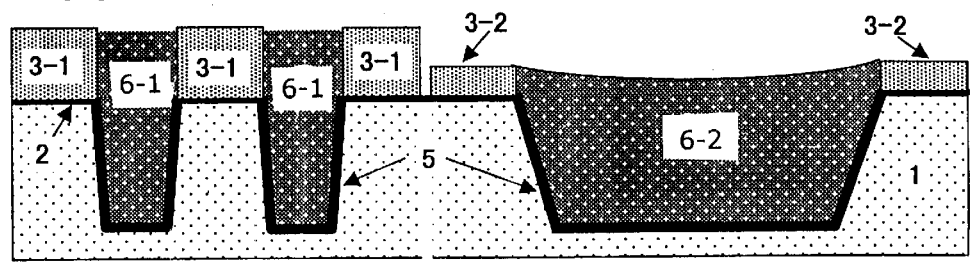
Figure 7D:
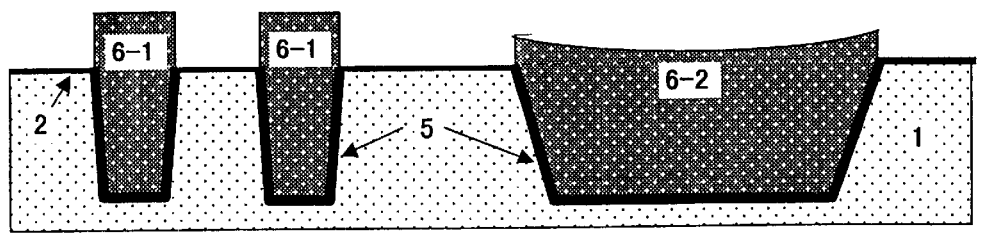

In FIG. 6(d), the buried CVD oxide film 6 and O3-TEOS-NSG film 9 are etched with a 5% fluoric acid aqueous solution. The selectivity ratio of the O3-TEOS-NSG film 9 to the CVD oxide film 6 in the fluoric acid aqueous solution is approximately 1.1 so that, first, the O3-TEOS-NSG film is removed. By adjusting the treatment time with the fluoric acid aqueous solution after the O3-TEOS-NSG removal to adjust the protruded height of the CVD oxide film 6 to approximately 150 Angstroms, an STI structure as shown in FIG. 6(d) is provided.

The Si3N4 film of the fourth embodiment or the poly-silicon film of the fifth embodiment is replaced by the O3-TEOS-NSG film which has a fluoric acid etching selectivity ratio of approximately 1.1 to the HDV CVD oxide film so that such a step as removal of the Si3N4 film in the fourth embodiment or poly-silicon film in the fifth embodiment is not necessary, resulting in the reduced manufacturing cost. The Si3N4 film 3, poly-silicon film 8, and O3-TEOS-NGS films are called "cap films" which protect the active area in the trench-etching or planarizing process.

What is claimed is:

1. A method of manufacturing a semiconductor device having a shallow trench isolation, comprising:

providing a semiconductor substrate having a main surface thereof;

selectively forming a silicon nitride pattern on the main surface of the substrate;

forming a trench on the main surface of the substrate using the silicon nitride pattern as a mask;

depositing a silicon oxide layer on the trench and the silicon nitride pattern so that not only the trench is filled with the silicon oxide layer but also the silicon nitride pattern is covered by the silicon oxide layer;

etching the silicon oxide layer by a chemical-mechanical polishing so that a level of a surface of the silicon oxide layer is substantially same to that of the silicon nitride pattern;

forming a spin-on-glass (SOG) layer on the etched silicon oxide layer and the silicon nitride pattern;

etching back the SOG layer and the silicon oxide layer by a plasma etching process so that the SOG layer is completely etched and a level of the silicon oxide layer is lower than that of the silicon nitride pattern; and removing the silicon nitride pattern.

2. A method of manufacturing a semiconductor device according to claim 1, wherein the level of the silicon oxide layer at the step of etching back the SOG layer is substantially equal to that of the main surface of the substrate.

3. A method of manufacturing a semiconductor device according to claim 2, wherein a height from the main surface of the substrate to the level of the silicon oxide layer at said step of etching back the SOG layer is about 150 angstroms.

4. A method of manufacturing a semiconductor device according to claim 1, wherein said silicon oxide layer is deposited by a biased high density plasma CVD method.

5. A method of manufacturing a semiconductor device according to claim 1, wherein said silicon nitride pattern is formed on the silicon substrate through an oxide film.

6. A method of manufacturing a semiconductor device according to claim 1, further comprising forming a thermal oxide layer on the trench before depositing the silicon oxide layer.

7. A method of manufacturing a semiconductor device having a shallow trench isolation, comprising:

providing a semiconductor substrate having a main surface thereof;

selectively forming a silicon nitride pattern on the main surface of the substrate;

forming a trench on the main surface of the substrate using the silicon nitride pattern as a mask;

depositing a silicon oxide layer on the trench and the silicon nitride pattern so that the trench is filled with and the silicon nitride pattern is covered by the silicon oxide layer;

etching the silicon oxide layer by a chemical-mechanical polishing so that a level of a surface of the silicon oxide layer is substantially equal to that of the silicon nitride pattern;

removing the silicon nitride pattern so that the silicon oxide layer protrudes from the main surface of the substrate;

forming a SOG layer on the silicon oxide layer and the main surface of the substrate so that a surface of the SOG layer is planarized; and etching back the SOG layer and the silicon oxide layer by a plasma etching process so that the SOG layer is completely etched and a level of the silicon oxide layer is substantially equal to that of the main surface of the substrate.

8. A method of manufacturing a semiconductor device according to claim 7, wherein a height from the main surface of the substrate to the level of the silicon oxide layer at said step of etching the SOG layer is about 150 angstroms.

9. A method of manufacturing a semiconductor device according to claim 7, wherein the trench includes a narrow width trench and a wide width trench and wherein a level of the silicon oxide layer and the silicon nitride pattern located on or around the wide width trench is lower than a level of the silicon oxide layer and the silicon nitride pattern located on or around the narrow width trench.

10. A method of manufacturing a semiconductor device according to claim 9, wherein a selection ratio of the SOG layer to the silicon oxide layer during the etching back step is determined such that a difference between a height H1 of the etched silicon oxide layer located on the narrow width trench from the main surface of the substrate and a height H2 of the etched silicon oxide layer located on the wide width trench from the main surface of the substrate is minimized.

11. A method of manufacturing a semiconductor device according to claim 7, wherein said silicon oxide layer is deposited by a biased high density plasma CVD method.

12. A method of manufacturing a semiconductor device according to claim 7, wherein said silicon nitride pattern is formed on the silicon substrate through an oxide film.

13. A method of manufacturing a semiconductor device according to claim 7, further comprising forming a thermal oxide layer on the trench before depositing the silicon oxide layer.

14. A method of manufacturing a semiconductor device having a shallow trench isolation, comprising:

provided a semiconductor substrate having a main surface thereof;

selectively forming a silicon nitride pattern on the main surface of the substrate;

forming a trench on the main surface of the substrate using the silicon nitride pattern as a mask;

depositing a silicon oxide layer on the trench and the silicon nitride pattern so that the trench is filled with and the silicon nitride pattern is covered by the silicon oxide layer;

etching the silicon oxide layer by a chemical-mechanical polishing so that a level of a surface of the silicon oxide layer is substantially equal to that of the silicon nitride pattern;

removing the silicon nitride pattern so that the silicon oxide layer protrudes from the main surface of the substrate;

forming a SOG layer on the silicon oxide layer and the main surface of the substrate so that a surface of the SOG layer is planarized; and etching back the SOG layer by a plasma etching process with a selectivity ratio of the SOG layer to the silicon oxide layer being about 1.0 so that the silicon oxide layer is exposed; and etching back the SOG layer and the silicon oxide layer by a plasma etching process with the selectivity ratio being about 0.7 or below so that the SOG layer is completely etched and a level of the silicon oxide layer is substantially equal to that of the main surface of the substrate.

15. A method of manufacturing a semiconductor device according to claim 14, wherein a height from the main surface of the substrate to the level of the silicon oxide layer at said step of etching the SOG layer is about 150 angstroms.

16. A method of manufacturing a semiconductor device according to claim 14, wherein the trench includes a narrow width trench and a wide width trench and wherein a level of the silicon oxide layer and the silicon nitride pattern located on or around the wide width trench is lower than a level of the silicon oxide layer and the silicon pattern layer located on or around the narrow width trench.

17. A method of manufacturing a semiconductor device according to claim 14, wherein a selection ratio of the SOG layer with the silicon oxide layer during the etching back step is determined such that a difference between a height H1 of the etched silicon oxide layer located on the narrow width trench from the main surface of the substrate and a height H2 of the etched silicon oxide layer located on the wide width trench from the main surface of the substrate is minimized.

18. A method of manufacturing a semiconductor device according to claim 14, wherein said silicon oxide layer is deposited by a biased high density plasma CVD method.

19. A method of manufacturing a semiconductor device according to claim 14, wherein said silicon nitride pattern is formed on the silicon substrate through an oxide film.

20. A method of manufacturing a semiconductor device according to claim 14, further comprising forming a thermal oxide layer on the trench before depositing the silicon oxide layer.

* * * * *